(12) United States Patent
Nishimura

(10) Patent No.: US 12,028,073 B2
(45) Date of Patent: Jul. 2, 2024

(54) DRIVER CONTROLLING SLEW RATE AND SWITCHING OF A SWITCHING OUTPUT STAGE

(71) Applicant: Analog Devices International Unlimited Company, Limerick (IE)

(72) Inventor: Naoaki Nishimura, Tokyo (JP)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/935,730

(22) Filed: Sep. 27, 2022

(65) Prior Publication Data

US 2024/0106424 A1  Mar. 28, 2024

(51) Int. Cl.
*H03K 5/04* (2006.01)
*H03K 17/687* (2006.01)

(52) U.S. Cl.
CPC .......... *H03K 5/04* (2013.01); *H03K 17/6871* (2013.01); *H03K 2217/0063* (2013.01); *H03K 2217/0072* (2013.01)

(58) Field of Classification Search
CPC ............. H03K 5/04; H03K 17/6871; H03K 2217/0063; H03K 2217/0072
See application file for complete search history.

(56) References Cited

U.S. PATENT DOCUMENTS

| | | |
|---|---|---|
| 6,281,730 B1 | 8/2001 | Vu et al. |
| 6,316,957 B1 | 11/2001 | Ang et al. |
| 6,768,363 B2 | 7/2004 | Yoo et al. |
| 7,190,225 B2 | 3/2007 | Edwards |
| 7,679,420 B1 | 3/2010 | Burkland et al. |
| 8,115,508 B2 | 2/2012 | Bucossi et al. |
| 9,553,510 B2 | 1/2017 | Tsukiji et al. |
| 9,614,517 B2 | 4/2017 | Krishna |
| 2012/0013315 A1* | 1/2012 | Popescu ................ H02M 3/156 323/268 |

(Continued)

FOREIGN PATENT DOCUMENTS

KR    100668515 B1    1/2007

OTHER PUBLICATIONS

Shin, Soon-Kyun, et al., "A Slew Rate-Controlled Output Driver having a Constant Transition Time over the Variations of Process, Voltage and Temperature", Proceedings of the IEEE 2005 Custom Integrated Circuits Conference, (Sep. 21, 2005), 231-234.

*Primary Examiner* — Metasebia T Retebo
(74) *Attorney, Agent, or Firm* — Schwegman Lundberg & Woessner, P.A.

(57) ABSTRACT

Drive circuits and methods control a switching output stage. The drive circuit includes a control drive circuit coupled to a control node of a low side power transistor and a switching node of a switching output stage. The control drive circuit includes a slew rate control circuit to control the adjusted drive current on the control node of the low side power transistor responsive to the slew rate of the output voltage to cause the low side power transistor to provide a constant slew rate for the output voltage over a range of values for the output current. A reverse detector circuit is coupled to the switching node and to a control node of a high side power transistor in the switching output stage. The reverse detector circuit controls activation of the high side power transistor in response to the output voltage on the switching node reaching a switching threshold.

9 Claims, 11 Drawing Sheets

(56) References Cited

U.S. PATENT DOCUMENTS

2016/0036433 A1* 2/2016 Toshiyuki ............... H02M 1/08
                                                    327/109
2017/0012617 A1* 1/2017 Moctezuma ........... H02H 3/087
2017/0012618 A1* 1/2017 Krishna ................ H03K 17/166
2022/0255424 A1* 8/2022 Fan ...................... H03K 17/166

* cited by examiner

DRIVER CONTROLLING SLEW RATE AND SWITCHING OF A SWITCHING OUTPUT STAGE

TECHNICAL FIELD

The present disclosure relates generally to controlling switching output stages, and more specifically to controlling slew rate of a switching output stage and controlling the switching of components within the switching output stage.

BACKGROUND

A switching output stage can include a plurality of power switches, such as MOSFET or other power transistors. A driver circuit controls the switching of the power transistors ON and OFF to provide a desired signal on an output node of the switching stage. A variety of different applications utilize driver circuits, with the characteristics of the signal generated or provided on the output node of the switching stage varying in different applications. Driver circuits are utilized, for example, in applications such as switching power converters, class-D amplifiers, and bus drivers that communicate digital signals over a bus or signal lines in an integrated circuit or other electronic system. A driver circuit utilizes the characteristics of a gate drive signal being supplied to control the switching of an associated power transistor so that the system including the driver circuit meets required operating parameters. For example, when turning OFF a power MOSFET transistor, a driver circuit may control a gate drive signal being applied to transistor so that in a Miller plateau region of this signal, during which a parasitic gate-to-drain capacitance CGD of the transistor is being charged, the driver circuit provides a reduced current for the gate drive signal. In this way, the driver circuit reduces a transition or slew rate of an output voltage signal on a drain of the power transistor, which reduces electromagnetic interference (EMI) that may otherwise be generated by the output voltage signal having a very high slew rate.

A driver circuit should also properly control the timing of the switching (i.e., turning ON or turning OFF) of power transistors in the switching stage to improve the efficiency of the circuit. For example, inductive loads on the output of a switching stage may result in induced voltages that can turn ON body diodes of power transistors in the switching output stage and the driver circuit ideally turns ON such a power transistor before its body diode turns ON. This eliminates power losses that arise from activation or turning ON of the body diode of a power transistor. Detecting the proper timing for switching the power transistors may be difficult, and may vary with different process, voltage, and temperature (PVT) variations in the driver circuit. There is a need for improved driver circuits and methods for controlling slew rate and switching of power transistors in a switching output stages.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

DETAILED DESCRIPTION

Figure 1:
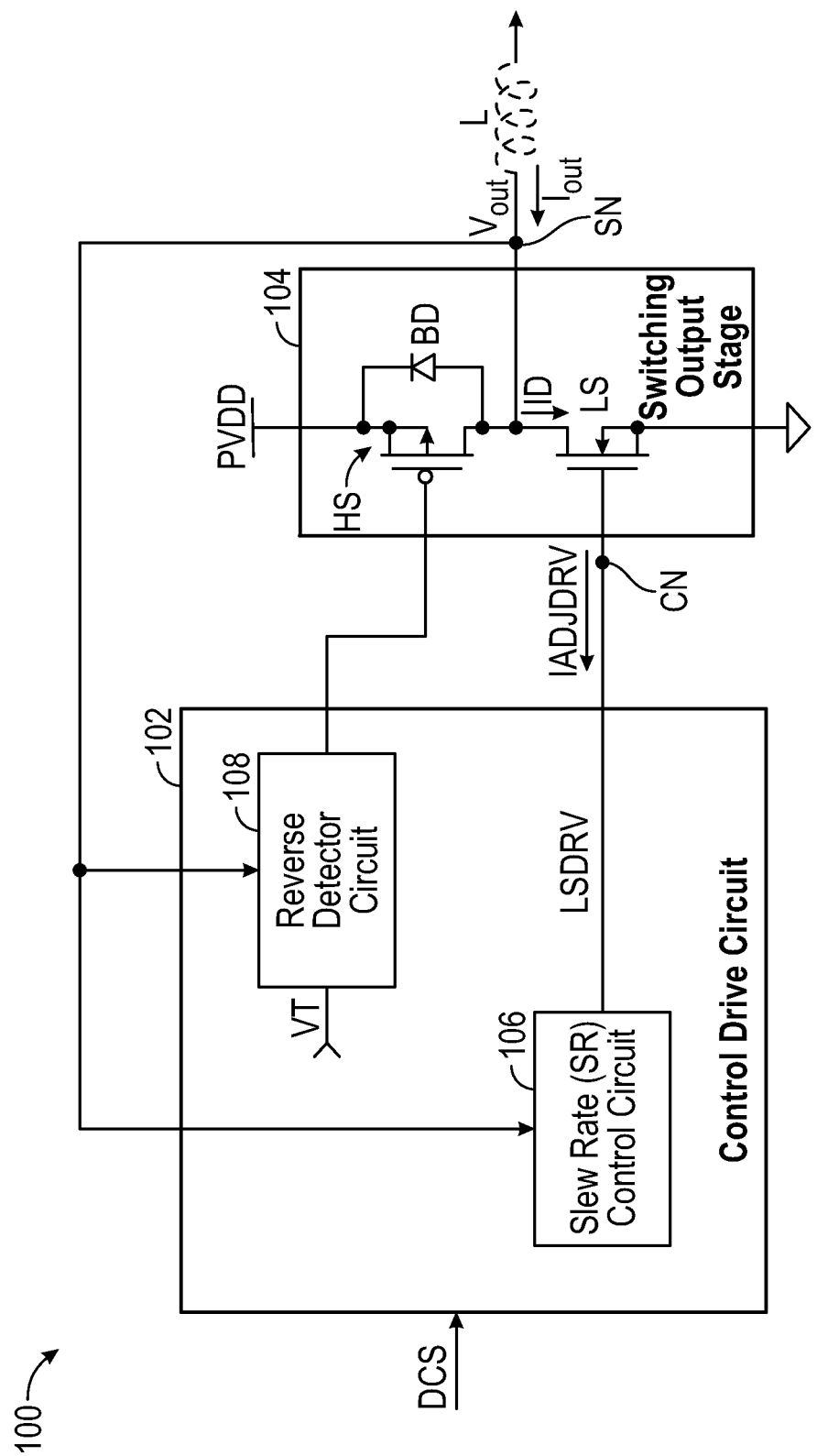
FIG. 1 is a functional block diagram of a driver circuit including a control drive circuit for controlling a slew rate of an output voltage signal in accordance with some embodiments of the present disclosure.

Embodiments of the present disclosure are directed to a driver or drive circuits and methods that can control a switching output stage, such as to provide a constant slew rate over a range of output currents. The constant slew rate can be used to provide reverse detection that can help eliminate or reduce conduction losses of a high side power transistor in the switching output stage due to activation of the body diode of this transistor, as will be explained in more detail below. A constant slew rate control circuit can generate a feedback signal having a value that is a function of a slew rate of an output voltage on a switching node of the switching output stage. This feedback signal can be generated through capacitive coupling, and can have a value that is a function of the slew rate of the output voltage. An adjusted drive current supplied to drive a low side power transistor in the switching output stage can then be adjusted based on the feedback signal, such as to cause the drive circuit to provide a constant slew rate for the output voltage over a range of output currents. The slew rate of drive circuit can have a value that is a function of a load current being supplied by the switching output stage, with the slew rate increasing as the load current increases. As mentioned above, a high slew rate may lead to unacceptably high levels of EMI being generated by the drive circuit. Drive circuits described herein can help eliminate this issue, providing a constant slew rate over a range of load currents.

The constant slew rate over a range of output currents that is provided by the drive circuit can then be utilized by a reverse detection circuit, such as to help prevent turning ON of a body diode of a high side power transistor in the switching output stage. More specifically, the constant slew rate can be used in setting an offset voltage that determines a voltage threshold or switching threshold utilized by a reverse detector circuit to activate a high side power transistor in the switching output stage in advance of a voltage applied to this high side power transistor reaching a level that would activate or turn ON the body diode of this power transistor.

For a given supply voltage, the driver circuit can provide a constant slew rate. This constant slew rate can vary, however, as a function of the supply voltage, such as to maintain a constant transition time for the output voltage signal and, in this way, to control EMI emissions generated by the driver circuit. This is in contrast to a driver circuit that provides the same slew rate over a range of supply voltages, resulting in shorter transition times for smaller supply voltages. These shorter transition times may result in unwanted EMI emissions. In embodiments of the present disclosure, the generation of the feedback signal is configured to provide the desired slew rate for a given supply voltage being applied to the driver circuit, such as with this slew rate being proportional to the supply voltage. Thus, for larger supply voltages the feedback signal causes controls the switching output stage to provide a higher slew rate for the output voltage while for smaller supply voltages a lower slew rate is provided. In this way, the driver circuit can be configured to adjust the slew rate as a function of the supply voltage to maintain the same transition time for the output voltage as a function the supply voltage. For example, the feedback can be generated through capacitive coupling between the switching node of the switching output stage and a feedback node, with a value of the capacitor determining the slew rate, as will be described in more detail below with reference to FIGS. 2A and 2B.

FIG. 1 is a functional block diagram of a driver circuit 100 including a control drive circuit 102 for controlling a slew rate of an output voltage signal VOUT generated on a switching node SN of a switching output stage 104 and for controlling activation of a high side power transistor HS of a switching stage 104 in accordance with some embodiments of the present disclosure. The control drive circuit 102 includes a slew rate (SR) control circuit 106 that is coupled to the switching node SN to receive the output voltage signal VOUT and is coupled to a control node CN of a low side power transistor LS in the switching output stage 104 to generate a low side driving signal LSDRV having an adjusted drive current IADJDRV to control switching of the low side power transistor based on a slew rate of the output voltage signal. The control drive circuit 102 further includes a reverse detector circuit 108 coupled to receive a voltage threshold or switching threshold VT and coupled to the switching node SN to receive the output voltage signal VOUT. In response to the output voltage signal VOUT reaching the switching threshold VT, the control drive circuit 102 controls activation of the high side drive signal HSDRV to control activation or turning ON of a high side power transistor HS in the switching output stage 104. In the switching output stage 104, the high side power transistor HS is coupled in series with the low side power transistor LS between a supply voltage node receiving a positive supply voltage PVDD and a reference voltage node receiving a reference voltage, which is ground in the example of FIG. 1. The configuration of the power transistors HS, LS in the switching output stage 104 illustrate an example embodiment of the switching output stage. A body diode BD of the high side power transistor HS is shown and will be discussed in more detail below in relation to operation of the reverse detector circuit 108. The switching output stage 104 may include additional transistors as well as other components, and different configurations of transistors, in some embodiments of the present disclosure. The high side power transistor HS and low side power transistor LS may also be referred to as high side transistor HS and low side transistor LS in the present description.

In the present description, the terms supply voltage node and supply voltage and the terms reference voltage node and reference voltage may be used interchangeably. Thus, a component may be said to coupled to the supply voltage PVDD or coupled to the reference voltage and it will be understood that this means such a component is coupled to the either the supply voltage node on which the supply voltage PVDD is received or the reference voltage node on which the reference voltage is received.

In operation, the control drive circuit 102 receives a drive control signal DCS and controls the activation and deactivation or turning ON and OFF of the low side and high side power transistors LS, HS in the switching output stage 104 in response to the drive control signal. Embodiments of the present disclosure, however, are directed more specifically to the operation of the control drive circuit 102 in controlling deactivation or turning OFF of the low side power transistor LS and activation or turning ON of the high side power transistor HS. Thus, this operation of the control drive circuit 102 will be emphasized and described in more detail herein. In the following example of the operation of the driver circuit 100, the high side power transistor HS is initially assumed to be turned OFF and the low side power transistor LS is initially assumed to turned ON. A current ID flows through the turned ON low side power transistor LS as shown FIG. 1. The output voltage signal VOUT is initially at a low level of approximately ground, and the LSDRV signal is initially at a suitable high level to turn ON the low side power transistor LS. The HSDRV signal is similarly initially at a suitable high level to turn OFF the high side power transistor HS. This is true where the low side power transistor is an N-type field effect transistor (FET) and the high side power transistor is a P-type FET as shown in FIG. 1. The DCS signal also has an initial value corresponding to these states of the high side and low side power transistors HS, LS and the output voltage signal VOUT.

The specific voltage values of the LSDRV, HSDRV signals will vary depending on the specifications and the type of the particular low side power transistor LS and high side power transistor HS being utilized and required gate-to-source voltages VGS for each of these power transistors. Although the example embodiment of FIG. 1 and other embodiments described herein illustrate the low side power transistor LS being an N-type FET and the high side power transistor HS being a P-type FET, each of these power transistors may be a different type of transistor in further embodiments of the present disclosure. In further embodiments of the driver circuit 100, each of the high side and low side power transistors HS, LS may be any one of an N-type FET, a P-type FET or a gallium nitride (GaN) FET. For example, in some embodiments each of the high side power transistor HS and low side power transistor LS is an N-type FET.

A GaN FET, unlike N-type and P-type FETs, does not include a body diode. As a result, in embodiments where the high side power transistor HS is a GaN FET the switching threshold VT of the reverse detector circuit 108 may be set equal to the positive supply voltage PVDD to turn ON the high side power transistor as soon as the output voltage signal VOUT reaches the positive supply voltage and in this way prevent the output voltage signal from significantly exceeding the value of the positive power supply voltage. The SR control circuit 106 and reverse detector circuit 108 may be utilized in controlling the turning OFF of the low side power transistor LS and turning ON the high side power transistor HS where each of these power transistors is any suitable type of transistor, such as an N-type FET, P-type FET, or GaN FET.

In operation, in response to the DCS signal changing values to indicate the low side power transistor LS is to be turned OFF, the SR control circuit 106 in the control drive circuit 102 generates the low side drive signal LSDRV signal to provide the adjusted drive current IADJDRV on the control node CN of the low side power transistor. The SR control circuit 106 controls the value of the adjusted drive current IADJDRV as a function of the slew rate SR of the output voltage signal VOUT and to maintain the slew rate at a constant value over a range of values for the output current IOUT. The feedback of the output voltage signal VOUT to the SR control circuit 106 enables to the slew rate of the output voltage signal to be detected and the adjusted drive current IADJDRV controlled to maintain the slew rate at the desired value. The operation of the SR control circuit 106 will be described in more detail below with reference to FIGS. 2A, 2B and 5A, 5B.

The adjusted drive current IADJDRV on the control node CN of the low side power transistor LS begins discharging the control node to turn OFF the low side power transistor LS. As the low side power transistor LS begins turning OFF, the output voltage signal VOUT on the switching node SN begins to increase at a rate given by the slew rate of this signal. When the output voltage signal VOUT reaches the switching threshold VT of the reverse detector circuit 108, the reverse detector circuit activates the high side drive signal HSDRV to turn ON the high side power transistor HS and thereby prevent the body diode BD of the high side power transistor from conducting. The structure of a FET includes the body diode BD of such a device. Preventing conduction of the body diode BD of the high side power transistor HS eliminates conduction losses that occur when such a body diode is activated or turned ON.

The reverse detector circuit 108 takes advantage of the constant slew rate of the output voltage signal VOUT during operation of the driver circuit 100 to turn ON the high side power transistor HS at the proper time before the body diode begins conducting (i.e., turns ON). The threshold voltage VT is set to a value that accounts for the time it will take the output voltage signal VOUT to reach the level at which the body diode of the high side power transistor HS will turn ON given the slew rate of the signal. This is determinable because the slew rate of the output voltage signal is determinable, which is not true if the slew rate varies. In some embodiments of the present disclosure, the value of the threshold VT also accounts for delays in operation of the reverse detector circuit 108 as well as the time for the high side power transistor HS to turn ON, as will be discussed in more detail below with reference to FIG. 6.

The mechanism through which the body diode of the high side power transistor HS may turn ON during operation of the driver circuit 100 will now be briefly described. The switching output stage 104 generally drives a conductive load, such as a long conductive wire or trace over which a signal is being communicated or a inductor in switching converter applications. This is represented in FIG. 1 through the inductor L shown in dashed lines. Due to the inductance L, when the low side power transistor LS is turned OFF the inductance will induce a positive voltage on the switching node SN that may be greater than the positive supply voltage PVDD. If this occurs, the body diode of the high side power transistor HS will conduct. Embodiments of the present disclosure can take advantage of the constant slew rate of the output voltage signal VOUT when the low side transistor LS is turning off to enable circuitry to be utilized to configure the reverse detector circuit 108 to detect the proper time to turn ON the high side power transistor HS and prevent conduction of the associated body diode.

Figure 2A:
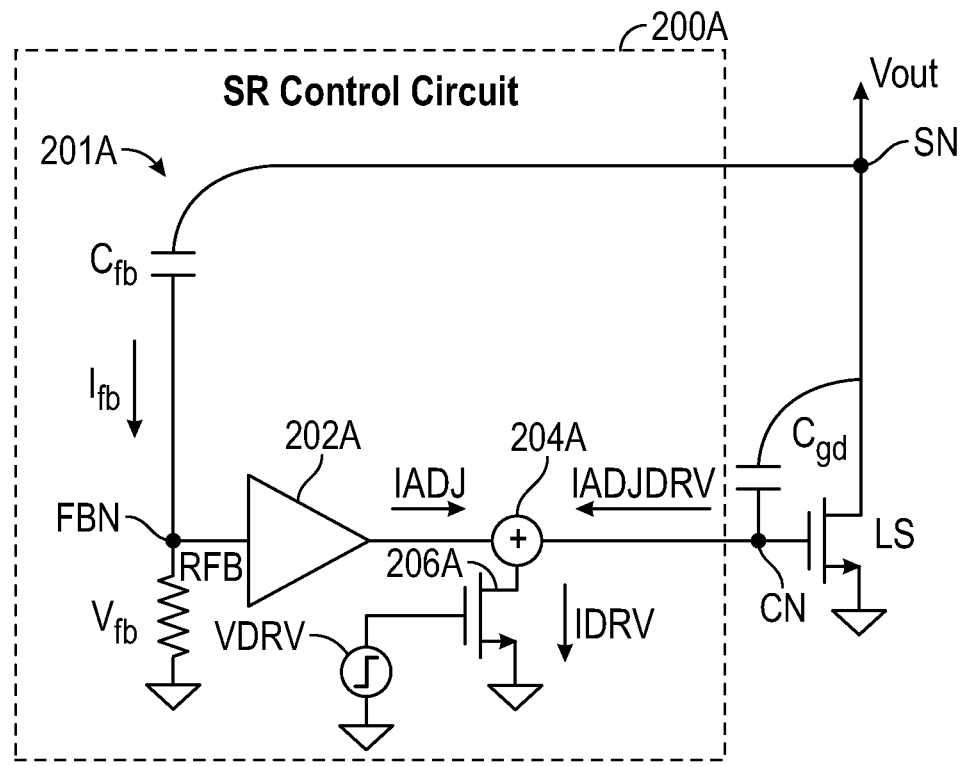
FIG. 2A is a functional block diagram of a slew rate control circuit in accordance with some embodiments of the present disclosure.

FIG. 2A is a functional block diagram of an SR control circuit 200A according to some embodiments of the present disclosure. The SR control circuit 200A corresponds to an embodiment of the SR control circuit 106 of FIG. 1. In addition to the SR control circuit 200A, FIG. 2A illustrates a portion of a switching output stage coupled to the SR control circuit, namely a low side power transistor LS and switching node SN of the switching output stage. The parasitic gate-to-drain capacitance CGD of the low side power transistor LS is also shown. The SR control circuit 200A implements a feedback control loop 201A between the switching node SN and the control node CN of the low side power transistor LS. The feedback control loop 201A operates to maintain the adjusted drive current IADJDRV on the control node CN of the low side the power transistor LS such that the slew rate SR of the output voltage signal VOUT on the switching node SN is maintained at the desired value.

The feedback control loop 201A includes a feedback capacitor CFB coupled between the switching node SN and a feedback node FBN. A resistive element RFB is coupled between the feedback node FBN and a reference voltage to generate a feedback voltage VFB having a value that is a function of the slew rate of the output voltage signal VOUT. An amplifier 202A has an input coupled to the feedback node FBN and an output coupled to a summation node or circuit 204A that is also coupled to the control node CN of the low side power transistor LS. The amplifier 202A provides an adjustment current IADJ to the summation node or circuit 204A. A drive transistor 206A is also coupled to the summation node or circuit 204A and receives a drive signal VDRV on a control node to control a drive current IDRV through the drive transistor. The summation circuit 204A operates to provide the adjusted drive current IADJDRV on the control node CN of the low side power transistor LS having a value that is equal to the drive current IDRV through the drive transistor 206A minus the adjustment current provided IADJ provided by the amplifier 202A (IADJDRV=(IDRV−IADJ)). In this way, the amplifier 202A operates in the feedback control loop 201A to control the value of the adjustment current IADJ which, in turn, controls the value of the adjusted drive current IADJDRV supplied on the control node CN to control the turning OFF of the low side power transistor LS.

The value of the feedback capacitor CFB is chosen to set the desired slew rate SR for the output voltage signal VOUT. The value of resistive element VFB may also be varied to set the value of the slew rate. In operation, a feedback current IFB flows through the feedback capacitor CFB, where the feedback current has a value that is proportional to the slew rate SR of the output voltage signal VOUT. The current through the feedback capacitor CFB is given by $$IFB = \frac{dVc}{dt} \times CFB = SR \times CFB$$

where the rate of change of the voltage Vc across the capacitor CFB corresponds to the slew rate SR of the output voltage signal VOUT. The feedback voltage VFB developed across the resistive element RFB is given by VFB=IFB× RFB=(SR×CFB)×RFB, and thus the feedback voltage is proportional to the slew rate SR of the output voltage signal VOUT. In operation, the amplifier 204A generates the adjustment current IADJ having a value that is proportional to the feedback voltage VFB. This control of the adjustment current IADJ controls the value of the adjusted drive current IADJDRV supplied to the low side power transistor LS which, in turn, controls the deactivation or turning OFF of the low side power transistor to thereby control the slew rate SR of the output voltage signal VOUT to the desired value.

In the embodiment of FIG. 2A, the drive signal VDRV is applied to the drive transistor 206A to provide the drive current IDRV on the control node CN of the low side power transistor LS to begin turning OFF this power transistor. The drive signal VDRV can be activated to turn ON the drive transistor 206A in response to the drive control signal DCS (FIG. 1) supplied to the control drive circuit 102 (FIG. 1) containing the SR control circuit 200A. When the DCS signal indicates the low side power transistor LS is to be turned OFF, the drive signal VDRV is activated to turn ON the drive transistor 206A to provide the drive current IDRV on the control node CN to begin discharging this node and thereby turning OFF the low side power transistor. The SR control circuit 200A simplifies the waveform to be provided by the drive signal VDRV, instead of controlling the adjusted drive current IADJDRV as desired to maintain the desired slew rate SR of the output voltage signal VOUT. Other approaches to driver circuits may include only the equivalent of the drive transistor 206A being operated to control the drive current IDRV in four phases including an initial phase having a large current to quickly begin discharging the control node CN of the power transistor LS followed by a second phase (i.e., the Miller plateau in which the gate-to-drain capacitance CGD is being discharged) in which the drive current is significantly reduced so that the slew rate of the VOUT signal is not too high. The circuitry used to control the drive transistor in this manner can be relatively complicated, involving the detection of the end of one phase and beginning of the next to control the drive transistor as desired. The SR control circuit 200A eliminates the need for generation of drive signal as in certain other approaches to driver circuits.

Figure 2B:
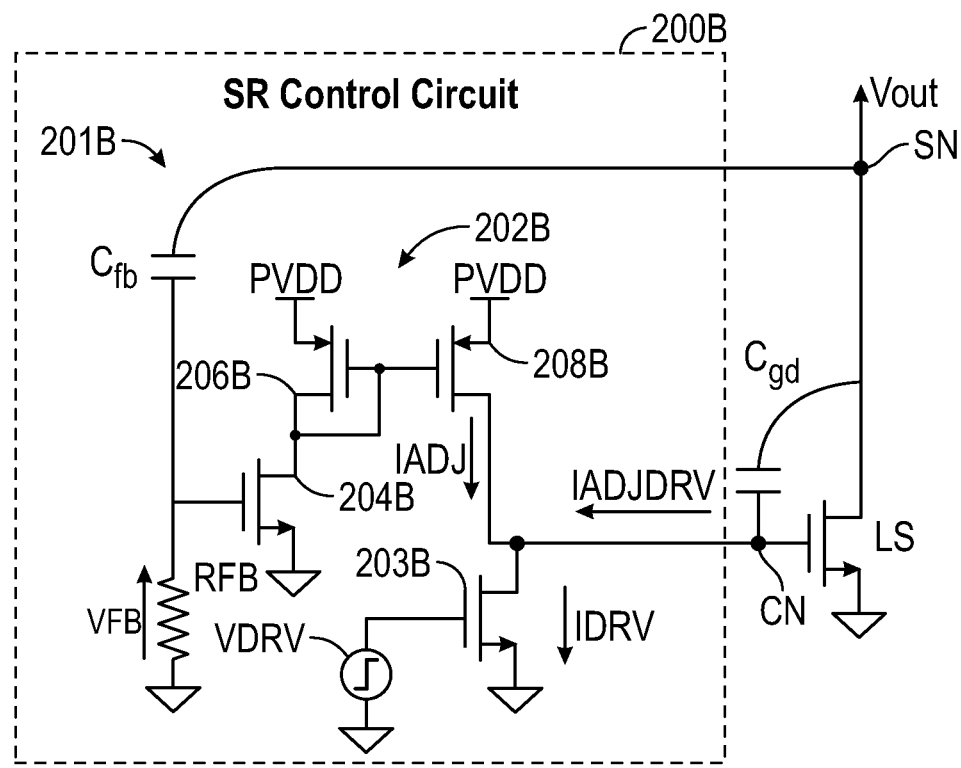
FIG. 2B is a more detailed schematic of the slew rate control circuit of FIG. 2A in accordance with some embodiments of the present disclosure.

FIG. 2B is a more detailed schematic of an SR control circuit 200B showing in more detail an example of circuitry of the SR control circuit 200A of FIG. 2A in accordance with some embodiments of the present disclosure. More specifically, the SR control circuit 200B illustrates a more detailed embodiment of an amplifier 202B corresponding to the amplifier 202A of FIG. 2A according to some embodiments of the present disclosure. The SR control circuit 200B includes feedback control loop 201B, a drive transistor 203B, a feedback capacitor CFB and resistive element RFB coupled in the same way as in the SR control circuit 200A of FIG. 2A, and thus these components need not again be described in detail. The amplifier 202B includes a transistor 204B and diode-coupled transistor 206B coupled in series between the supply voltage PVDD and reference voltage. A transistor 208B is coupled between the supply voltage PVDD and the control node CN of the low side power transistor LS to supply the adjustment current IADJ to the control node. A control node of the transistor 208B is coupled to the interconnected gate and drain of the diode-coupled transistor 206B to form a current mirror. The sizes of the transistors 206B, 208B are set to provide the required adjustment current IADJ through the transistor 208B in response to a corresponding current through diode-coupled transistor 206B.

In operation, a feedback voltage VFB is developed across the resistive element RFB that is proportional to the slew rate of the output voltage signal VOUT and the feedback control loop 201B functions to maintain the feedback voltage VFB at approximately the threshold voltage VT of the transistor 204B. If the slew rate SR of the output voltage signal VOUT becomes too fast, the feedback voltage VFB increases due to the increased feedback current through feedback capacitor CFB. In response to the increased feedback voltage VFB, the transistor 204B turns ON more and a voltage on the gate of the diode-coupled transistor 206B decreases to increase a current through this transistor. This gate of the transistor 208B is also driven lower, increasing the adjustment current IADJ through the transistor 208B that is supplied to the control node CN of the low side power transistor LS. This effectively reduces the adjusted drive current IADJDRV being applied to the low side power transistor LS and slows down the turning OFF of this transistor to thereby slow the slew rate of the output voltage signal VOUT. The feedback control loop 201B operates in this way to limit maintain the slew rate SR of the output voltage signal VOUT at the desired value.

Figure 3:
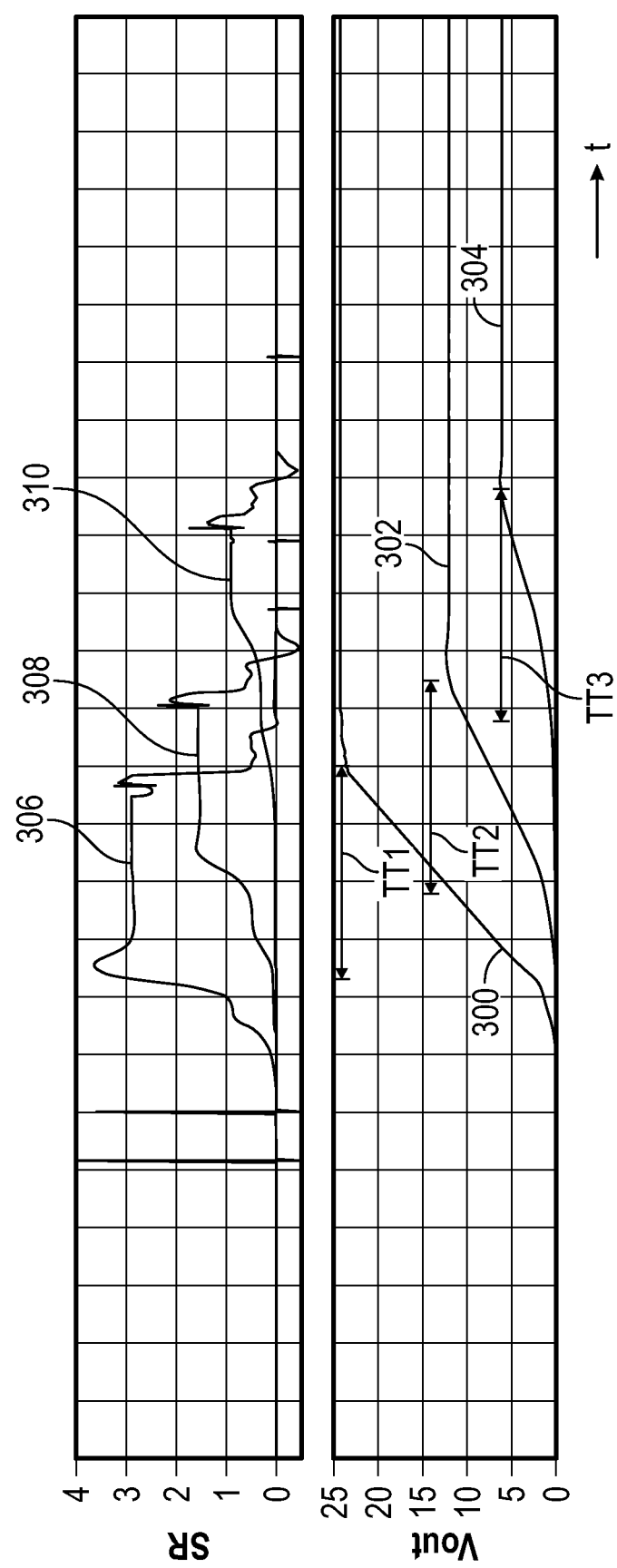
FIG. 3 illustrates operation of the slew rate control circuit of FIG. 2 in providing a slew rate that is proportional to a supply voltage to maintain a constant transition time for the output voltage signal in accordance with some embodiments of the present disclosure.

FIG. 3 is a computer simulation transient waveform that illustrates operation of the SR control circuit 200B in providing a slew rate that is proportional to a supply voltage PVDD to maintain a constant transition time TT for the output voltage signal VOUT in accordance with some embodiments of the present disclosure. In FIG. 3 the bottom graph shows the output voltage signal VOUT over time for three different supply voltages PVDD. A first plot 300 of the VOUT signal is for a supply voltage PVDD of 24 volts and shows the transition of the output voltage signal from a low level of ground (zero volts) to the supply voltage of 24 volts. A second plot 302 shows the transition of the output voltage signal VOUT between the low level and a second supply voltage PVDD of 12 volts and a third plot 304 shows the transition of the output voltage signal between the low level and a third supply voltage PVDD of 6 volts.

The top graph in FIG. 3 illustrates the corresponding slew rates 306, 308 and 310 over time for the corresponding transitions in the plots 300, 302 and 304 of the output voltage signal VOUT shown in the lower graph. As seen in these graphs, the slew rate SR of the output voltage signal VOUT is a function of the value of the supply voltage PVDD and in this way the transition time TT of the output voltage signal is the same for different supply voltages. This is illustrated in the lower graph of FIG. 3 where the first transition time TT1 is shown for the plot 300, a second transition time shown TT2 for the plot 302, and a third transition time TT3 shown for the plot 304. Each of these transition times TT1-TT3 is approximately the same. In the SR control circuit 200B, the value of the feedback capacitor CFB is selected based on the value of the supply voltage PVDD so that the SR control circuit controls the output voltage signal VOUT to have the corresponding slew rate SR that results in the same transition time TT for the output voltage signal given the value of the supply voltage.

Figure 4:
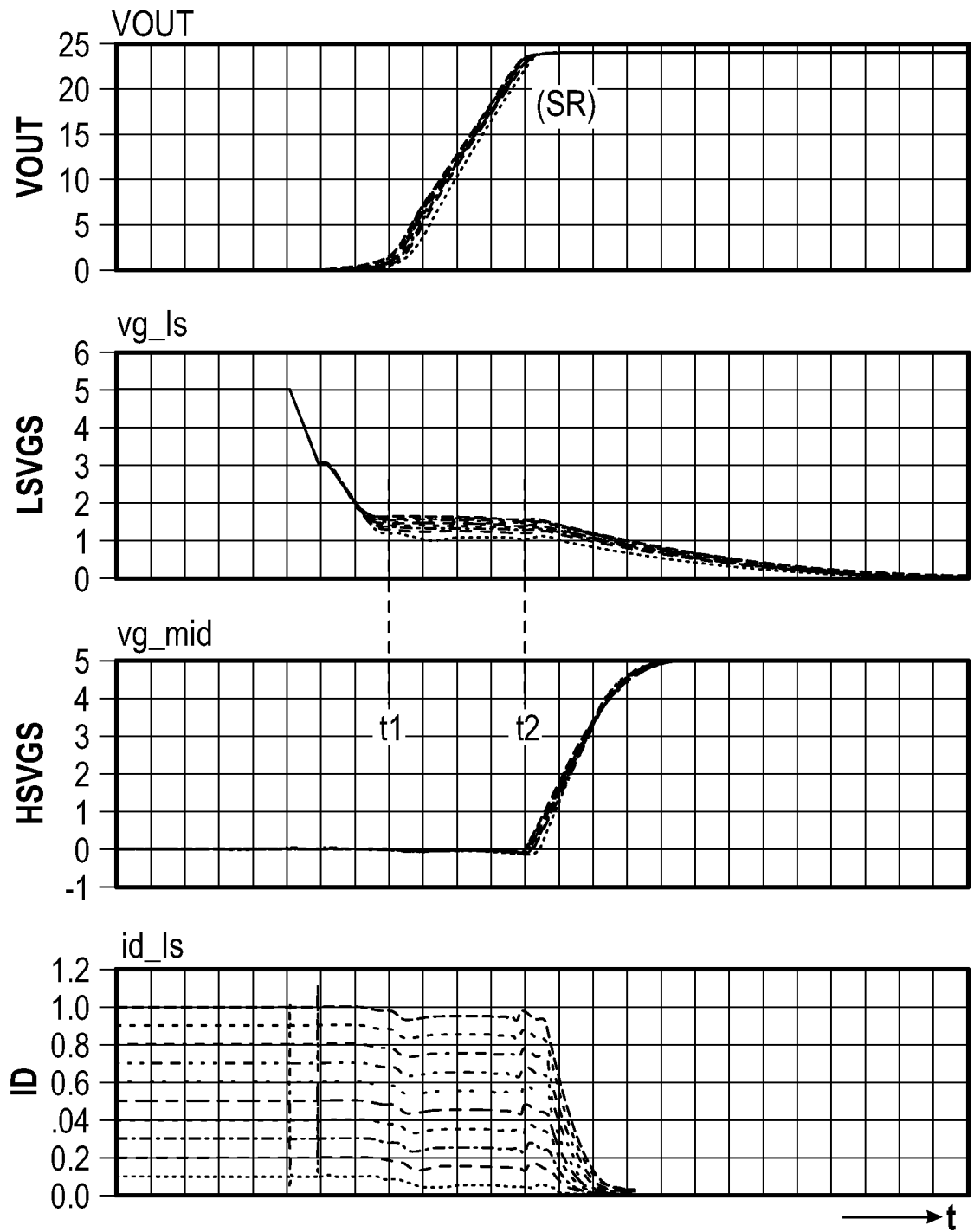
FIG. 4 shows several graphs illustrating operation of the slew rate control circuit of FIG. 2 in maintaining an approximately constant slew rate for the output voltage signal over a range of load currents in accordance with some embodiments of the present disclosure.

FIG. 4 shows several graphs illustrating operation of the SR control circuit 200B in maintaining an approximately constant slew rate SR for the output voltage signal VOUT over a range of load currents, where the "load current" is assumed to correspond to the current ID flowing through the low side power transistor LS as mentioned above with regard to the switching output stage 104 of FIG. 1. The bottom graph in FIG. 4 illustrates a number of different values for the current ID. The top graph shows that the slew rate SR of the output voltage signal VOUT is approximately constant over this range of values for the current ID. In FIG. 4, a graph of the voltage on the gate of the low side power transistor LS is also shown, with this voltage being designated LSVGS in the figure. The plot of the voltage LSVGS illustrates the Miller plateau region of this signal between times t1 and t2, which corresponds to the time during which the output voltage signal VOUT is transitioning from a low level to a high level. Thus, even over a range of values for the current ID through the low side power transistor LS, the SR control circuit 200B maintains the slew rate SR of the output voltage signal VOUT approximately constant. FIG. 4 also shows an HSVGS signal corresponding to the gate-to-source across the high side power transistor HS (FIG. 1) and illustrates turning ON of this transistor after the low side power transistor LS has been turned OFF through the operation of the reverse detector circuit 108 of FIG. 1, as will be explained in more detail below with reference to FIG. 6.

Figure 5A:
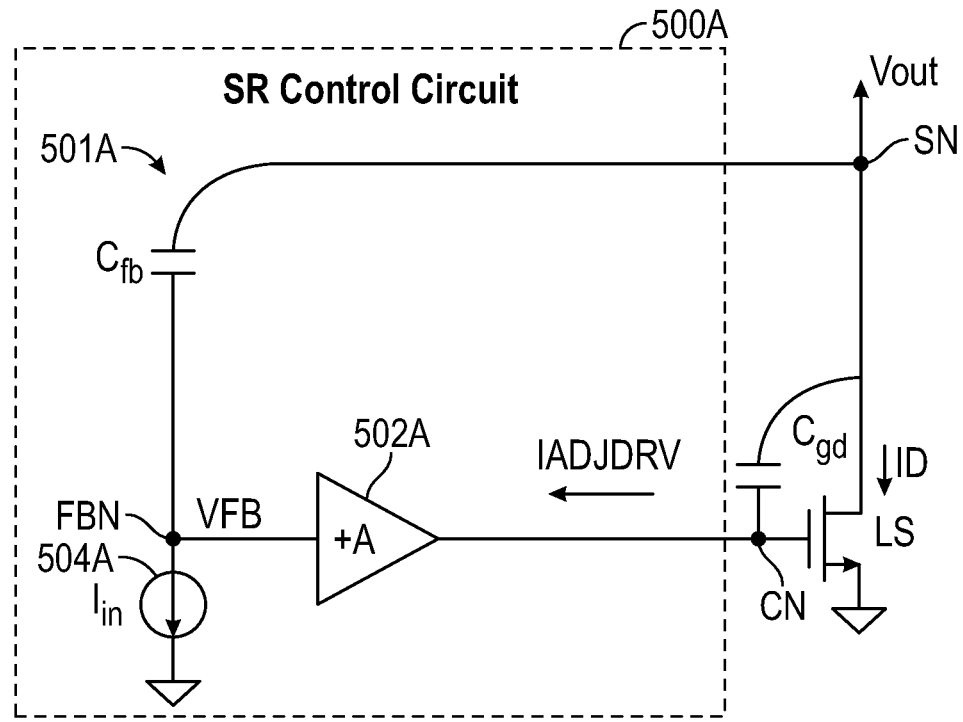
FIG. 5A is a functional block diagram of a slew rate control circuit in accordance with some embodiments of the present disclosure.

FIG. 5A is a functional block diagram of a SR control circuit 500A in accordance with further embodiments of the present disclosure. The SR control circuit 500A includes a feedback control loop 501A that directly controls the adjusted drive current IADJDRV that is provided on the control node CN of the low side power transistor LS. In addition to the SR control circuit 500A, FIG. 5A illustrates a portion of a switching output stage coupled to the SR control circuit, namely a low side power transistor LS and the switching node SN of the switching output stage. The feedback control loop 501A includes a feedback capacitor CFB coupled between the switching node SN and a feedback node FBN. A current source IIN is coupled between the feedback node FBN and a reference voltage to generate a feedback voltage VFB on the feedback node having a value that is a function of the slew rate of the output voltage signal VOUT. An amplifier 502A has an input coupled to the feedback node FBN and an output coupled to the control node CN of the low side power transistor LS to directly control the adjusted drive current IADJDRV provided to control the low side power transistor. In operation, the voltage VFB having a value that is proportional to the slew rate SR of the output voltage signal VOUT is provided to the amplifier 502A, with the amplifier controlling the adjusted drive current IADJDRV to thereby control the low side power transistor LS to maintain the slew rate SR of the output voltage signal VOUT at the desired value.

Figure 5B:
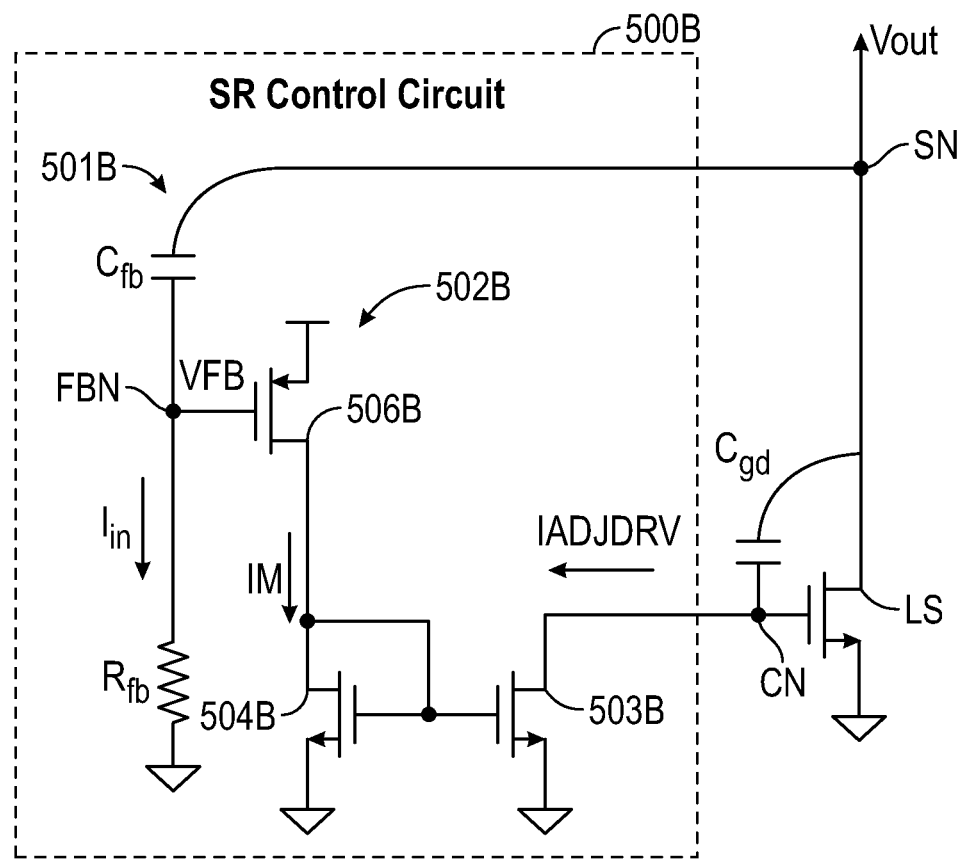
FIG. 5B is a more detailed schematic of the slew rate control circuit of FIG. 5A in accordance with some embodiments of the present disclosure.

FIG. 5B is a more detailed schematic of an SR control circuit 500B showing in more detail an example of circuitry of the SR control circuit 500A of FIG. 5A in accordance with some embodiments of the present disclosure. More specifically, the SR control circuit 500B illustrates a more detailed embodiment of an amplifier 502B corresponding to the amplifier 502A of FIG. 5A according to some embodiments of the present disclosure. The SR control circuit 500B includes feedback control loop 501B including a feedback capacitor CFB and a resistive element RFB forming the current source IIN of FIG. 5A. The amplifier 502B includes a transistor 503B coupled between the control node CN of the low side power transistor LS and a reference voltage. A control node of the transistor 503B is coupled to a diode-coupled transistor 504B to form a current mirror, with the transistor 504B being coupled in series with a transistor 506B between the supply voltage PVDD and a reference voltage. A control node of the transistor 506B is coupled to the feedback node FBN.

In operation, the feedback voltage VFB is generated having a value that is proportional to the slew rate SR of the output voltage signal VOUT on the switching node SN. In response to the feedback voltage VFB, the transistor 506B is activated to control a voltage on the interconnected drain and gate of the diode-coupled transistor 504B and supply a current IM through this transistor. The current IM through the diode-coupled transistor 504 is mirrored by the transistor 503B to generate the adjusted drive current IADJDRV supplied to the control node CN of the low side power transistor LS. The SR control circuit 500B would be activated to turn OFF the low side power transistor LS and control the slew rate SR of the output voltage signal VOUT in response to the drive control signal DCS (FIG. 1) being driven to a level indicating that the low side power transistor is to be turned OFF.

Simulation results of driver circuits including slew rate SR control circuits according to embodiments of the present disclosure illustrate improvements of slew rate control over a wide range of load currents as compared to conventional driver circuits for power transistors in switching output stages. Simulation results for embodiments of the present disclosure including a SR control circuit such as the SR control circuit 100, 501A, 501B described above illustrate slew rate control towards an end of the transition of the output voltage signal VOUT near the positive supply voltage PVDD, which is the region of interest for proper operation of the reverse detector circuit 108 of FIG. 1, provide a variation of the slew rate SR of only 4.7% over a wide range of 0.3-3 Amperes for the drain current ID through the low side power transistor LS. In contrast, simulation results for a conventional turn OFF driver for the low side power transistor LS, which is typically a simple NMOS transistor coupled to the control node of this power transistor, result in a variation of slew rate SR of the output voltage signal VOUT of 20% in this same region of interest for the output voltage signal. The simulation with and without the SR control circuit both had a target slew rate SR of 1.5 GV/s, where GV corresponds to gigavolts. This target slew rate may also be designated as 1.5 V/ns where "ns" corresponds to nanosecond.

Figure 6:
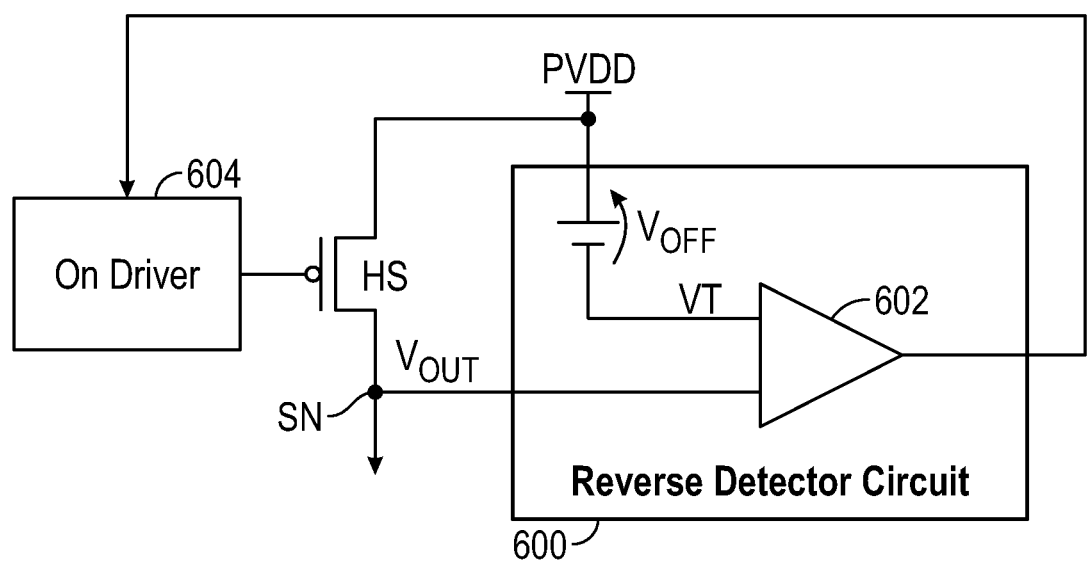
FIG. 6 is a schematic and functional block diagram illustrating a reverse detector circuit in accordance with some embodiments of the present disclosure.

FIG. 6 is a schematic and functional block diagram illustrating a reverse detector circuit 600 in accordance with some embodiments of the present disclosure. The reverse detector circuit 600 corresponds to one embodiment of the reverse detector circuit 108 of FIG. 1. The reverse detector circuit 600 includes a comparator 600 and to having a first input coupled to the switching node SN in an associated switching output stage. Only a portion of the associated switching output stage, namely the high side power transistor HS and switching node SN, are shown in FIG. 6. A second input of the comparator 602 receives a switching threshold VT having a value that is based on the positive supply voltage PVDD being applied to the high side power transistor HS. More specifically, the switching threshold VT is determined by the value of an offset voltage VOFF, where VT=(PVDD−VOFF). An output of the comparator 602 is coupled to an ON driver circuit 604, which controls turning ON of the high side power transistor HS in response to the output from the comparator. In operation, when the output voltage signal VOUT on the switching node SN reaches the switching threshold VT, the comparator 602 applies an active output to the ON driver 604 which, in turn, supplies a drive signal to turn ON the high side power transistor HS.

Figure 7A:
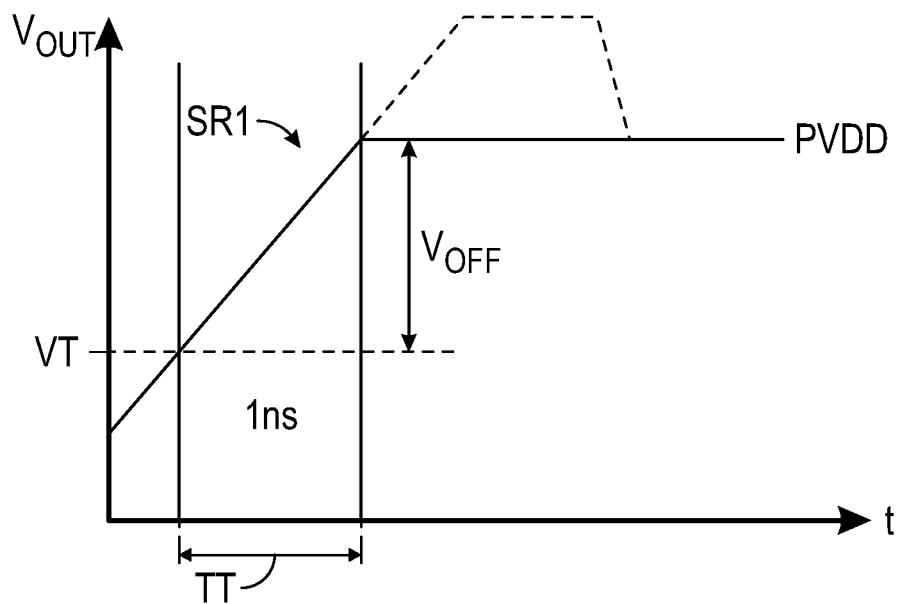
FIGS. 7A and 7B illustrate operation of the reverse detector circuit of FIG. 6 in accordance with some embodiments of the present disclosure.
Figure 7B:
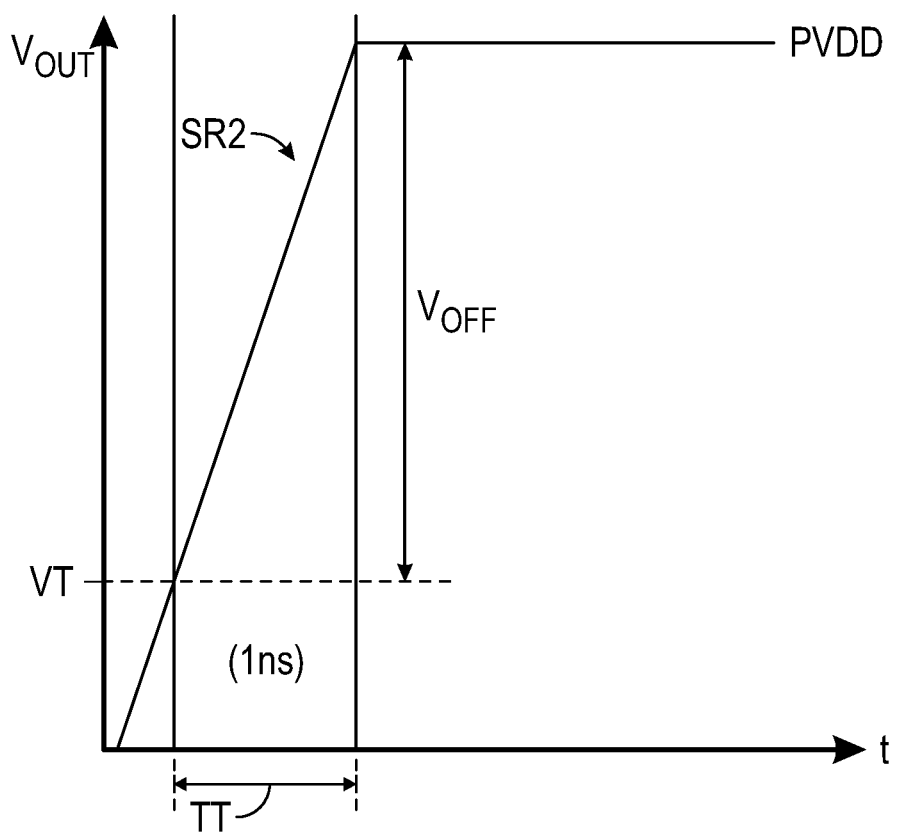

The operation of the reverse detector circuit 600 will now be described in more detail with reference to FIGS. 7A and 7B. FIGS. 7A and 7B illustrate transitions of the output voltage signal VOUT for two different slew rates, a slower slew rate SR1 in FIG. 7A and a faster slew rate SR2 in FIG. 7B. FIGS. 7A and 7B illustrate how the value of the offset voltage VOFF is selected so that the switching threshold VT has a value allowing the reverse detector circuit 600 to control turning ON of the high side power transistor HS prior to the output voltage signal VOUT reaching a value of the positive supply voltage PVDD. As mentioned above, the high side power transistor HS should be turned ON prior to the output voltage signal VOUT exceeding the supply voltage PVDD to prevent a body diode of the high side power transistor from turning ON. The VOUT signal can exceed the value of the supply voltage PVDD due to inductive loads on the output of a switching stage when the low side transistor LS is being turned OFF, as will be appreciated by those skilled in the art.

FIGS. 7A and 7B illustrate that when the slew rate SR of the output voltage signal VOUT is constant over a range of output currents, the offset voltage VOFF and thereby the switching threshold VT may be set so that the high side power transistor HS is turned ON before the output voltage signal VOUT reaches the supply voltage PVDD to prevent activating the body diode of this high side power transistor. When the slew rate is faster, as for slew rate SR2 in FIG. 7B, the value of the offset voltage VOFF is larger resulting in a switching threshold VT that is lower so that the high side transistor HS is turned ON prior to the induced output voltage signal VOUT on the switching node SN reaching the supply voltage PVDD. The converse is true for slower slew rates as with the slower slew rate SR1 shown in FIG. 7A, with the value of the offset voltage VOFF being smaller resulting in a switching threshold VT that is larger and closer to the value of the supply voltage PVDD. The transition time TT of the output voltage signal VOUT is the same in both situations, so the switching threshold VT may be closer to the supply voltage PVDD with the slower slew rate SR1 before activating the ON driver 604 to turn ON the high side transistor HS. The comparator 602 need not be an ultrafast comparator as is required in many convention circuits that wait until the output voltage signal VOUT reaches the value of the supply voltage PVDD. Through the offset voltage VOFF and corresponding switching threshold VT the comparator 602 is able to act in advance of the VOUT signal reaching a value that would activate the body diode of the high side power transistor HS and is able to control activation of the high side power transistor before this happens. In some embodiments, the switching threshold VT has a value based on a value of a positive supply PVDD, the slew rate SR of the output voltage signal VOUT, and a delay time DT of the reverse detector circuit 600 and ON driver 604. Thus, if a delay of the comparator 602 and ON driver 604 is longer than the transition time TT of the output voltage signal VOUT, then these delays could also be taken into account in setting the value offset voltage VOFF and thereby the switching threshold VT.

Figure 8:
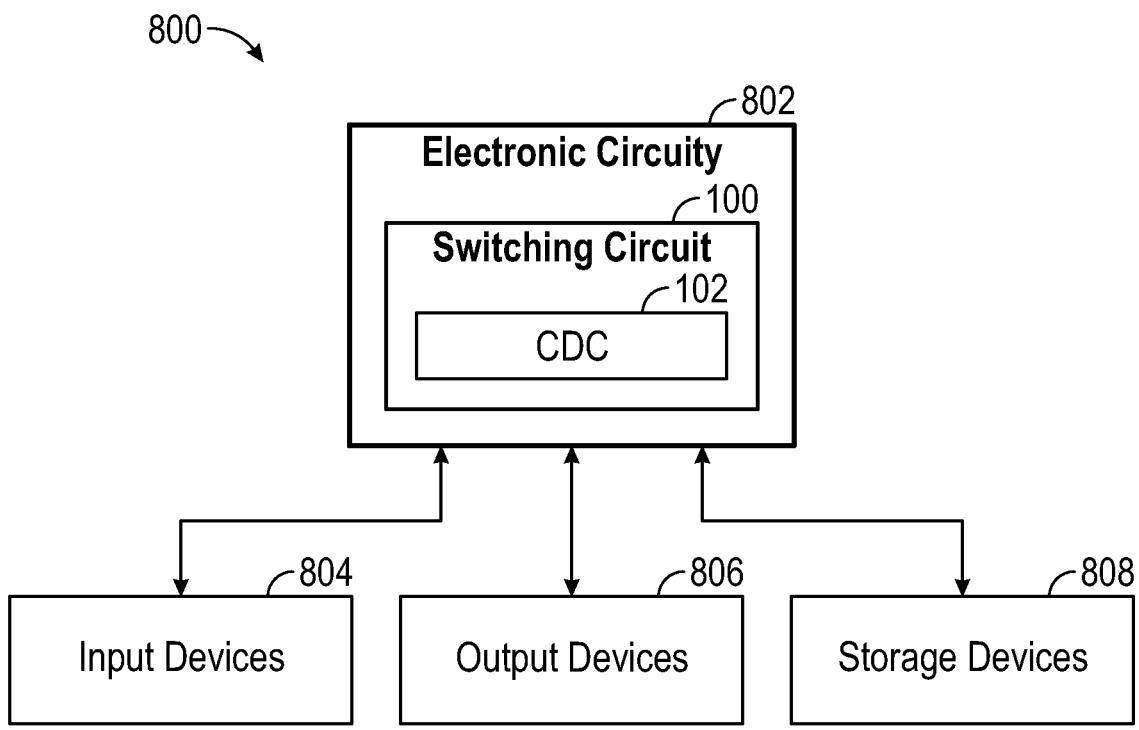
FIG. 8 is a block diagram of an electronic system including electronic circuitry including a driver circuit according to some embodiments of the present disclosure.

Driver circuits according to embodiments of the present disclosure can be embodied in a variety of different types of electronic devices and systems, such as audio, computer, smart phone or other portable device, and industrial systems and devices. FIG. 8 is a block diagram of an electronic system 800 including electronic circuitry 802 including the driver circuit 100 according to some embodiments of the present disclosure. The electronic circuitry 802 includes circuitry for performing various functions required for the particular system, such as executing specific software to perform specific calculations or tasks where the electronic system is a computer system or performing audio processing of signals where the electronic system is an audio system. In addition, the electronic system 800 may include one or more input devices 804, such as a keyboard or a mouse or touchpad, coupled to the electronic circuitry 802 to allow an operator to interface with the system. The electronic system 800 can also include one or more output devices 806 coupled to the electronic circuitry 802, such output devices can include a video display such as an LCD display. One or more data storage devices 808 can be coupled to the electronic circuitry 802 to store data or retrieve data from storage media (not shown). Examples of typical storage devices 808 include semiconductor memories such as RAM, SRAM, and FLASH memory drives.

Figure 9:
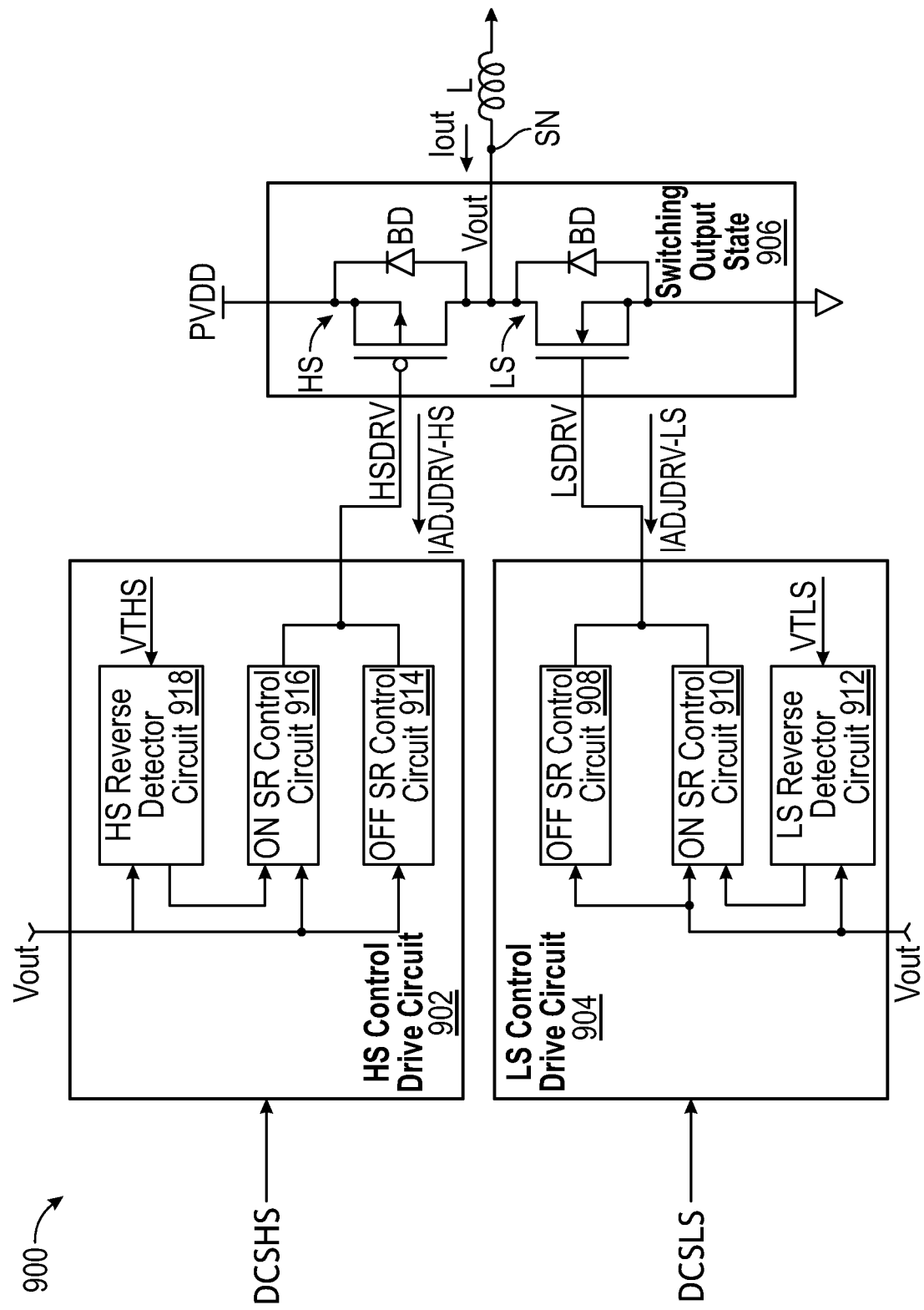
FIG. 9 is a functional block diagram of a driver circuit including control drive circuits for controlling a rising and falling edge slew rate of an output voltage signal in accordance with some embodiments of the present disclosure.

FIG. 9 is a functional block diagram of a driver circuit 900 including a high side (HS) control drive circuit 902 and a low side (LS) control drive circuit 904 for controlling both low-to-high and high-to-low slew rate SR of an output voltage signal VOUT generated on a switching node SN of a switching output stage 906 in accordance with some embodiments of the present disclosure. The HS control drive circuit 902 and LS control drive circuit 904 also control activation of a high side power transistor HS and a low side power transistor LS in the switching stage 906. In the driver circuit 900, each of the HS control drive circuit 902 and LS control drive circuit 902 controls the turning ON and turning OFF of the corresponding power transistor HS and LS to thereby control the slew rate SR of high-to-low and low-to-high transitions of the output voltage signal VOUT. The driver circuit 900 in this way controls the turning OFF of the low side power transistor LS and turning ON of the high side power transistor HS in the same was as described for the driver circuit 100 of FIG. 1. In addition, the drive circuit 900 also controls the turning ON and OFF of the power transistors LS, HS under additional operating conditions of the switching output stage 906.

The control drive circuit 904 includes an OFF slew rate (SR) control circuit 908 coupled to the switching node SN to receive the output voltage signal VOUT and also coupled to a control node of the low side power transistor LS to generate a low side driving signal LSDRV having an adjusted current IADJDRV-LS to control switching OFF of the low side power transistor based on a slew rate of the output voltage signal. An ON SR control circuit 910 in the LS control drive circuit 904 is also coupled to the switching node SN to receive the output voltage signal VOUT and is coupled to the control node of the low side power transistor LS to generate the LSDRV signal having the adjusted current IADJDRV-LS to control switching ON of the low side power transistor LS based on the slew rate of the output voltage signal.

A low side (LS) reverse detector circuit 912 in the LS control drive circuit 904 is coupled to receive a low side voltage threshold or low side switching threshold VTLS and is coupled to the switching node SN to receive the output voltage signal VOUT. In response to the output voltage signal VOUT reaching the low side voltage threshold VTLS, the LS reverse detector circuit 912 provides a signal to the ON SR control circuit 910 to thereby control generation of the LSDRV signal to turn ON of the low side power transistor LS. The low side switching threshold VTLS is set to a value so that given the high-to-low slew rate SR of the output voltage signal VOUT the low side power transistor LS will be turned ON before the body diode BD of this low side power transistor turns ON. The operation of the reverse detector circuit 912 is analogous to the operation described above for the reverse detector circuit 108 of FIG. 1 and reverse detector circuit 600 of FIG. 6, and will be appreciated by those skilled in the art and will not be described in more detail herein.

The HS control drive circuit 902 includes an OFF slew rate (SR) control circuit 914, an ON SR control circuit 916, and a high side (HS) reverse detector circuit 918 coupled to the high side power transistor HS in an analogous manner as the corresponding components 908-912 of the LS control drive circuit 904 and the low side power transistor LS. The OFF SR control circuit 914 and ON SR control circuit 916 are coupled to a control node of the high side power transistor HS to generate a high side driving signal HSDRV having an adjusted current IADJDRV-HS to control switching ON and OFF of the high side power transistor based on a slew rate SR of the output voltage signal VOUT. The HS reverse detector circuit 918 receives a high side voltage threshold or high side switching threshold VTHS and is coupled to the switching node SN to receive the output voltage signal VOUT. The HS reverse detector circuit 918 corresponds to the reverse detector circuit 108 of FIG. 1 or reverse detector circuit 600 of FIG. 6 in embodiments of the drive circuit 900. Accordingly, in response to the output voltage signal VOUT reaching the high side voltage threshold VTHS, the HS reverse detector circuit 918 provides a signal to the ON SR control circuit 916 to thereby control generation of the HSDRV signal to turn ON of the high side power transistor HS. The high side switching threshold VTHS is set to a value so that given the low-to-high slew rate SR of the output voltage signal VOUT the high side power transistor HS will be turned ON before the body diode BD of this high side power transistor turns ON.

In operation, the HS control drive circuit 902 receives a high side drive control signal DCSHS and LS control drive circuit 904 receives a low side drive controls signal DCSLS, and these control drive circuits operate, in response to the DCSHS, DCSLS signals, to control the activation and deactivation or turning ON and OFF of the low side and high side power transistors LS, HS in the switching output stage 906. More specifically, the OFF SR control circuit 914 and ON SR control circuit 916 in the HS control drive circuit 902 generate the HSDRV to provide the adjusted drive current IADJDRV-HS to control the high side power transistor HS so that the output voltage signal VOUT has an approximately constant slew rate SR over a wide range of output currents IOUT for the drive circuit 900. Similarly, the OFF SR control circuit 908 and ON SR control circuit 910 in the LS control drive circuit 904 generate the LSDRV to provide the adjusted drive current IADJDRV-LS to control the low side power transistor LS so that the output voltage signal VOUT has an approximately constant slew rate SR over a wide range of output currents IOUT for the drive circuit 900.

When the DCSHS and DCSLS signals indicate the low side power transistor LS is to be turned OFF and the high side power transistor HS is to be turned ON, the HS reverse detector circuit 918 operates in the same was as described for the reverse detector circuits 108, 600 of FIGS. 1, 6. More specifically, in response to output voltage signal VOUT reaching the VTHS threshold, the HS reverse detector circuit 918 provides a signal to the ON SR control circuit 916 to turn ON the high side power transistor HS before the body diode BD of this transistor is activated. Conversely, when the DCSHS and DC SLS signals indicate the high side power transistor HS is to be turned OFF and the low side power transistor LS is to be turned ON, the LS reverse detector circuit 912 operates in a similar manner to activate the low side power transistor. More specifically, in response to output voltage signal VOUT reaching the VTLS threshold, the LS reverse detector circuit 912 provides a signal to the ON SR control circuit 910 to turn ON the low side power transistor LS before the body diode BD of this power transistor is activated. During this phase of operation of the driver circuit 900, the inductance L coupled to the switching node SN will result in a negative voltage being induced on the switching node and, as a result of this negative voltage, the body diode BD of the low side power transistor LS would turn ON if the LS reverse detector circuit 912 was not present. This operation for the LS reverse detection circuit 912 and low side power transistor LS is analogous to the operation of the HS reverse detector 918 and high side power transistor HS.

Figure 10A:
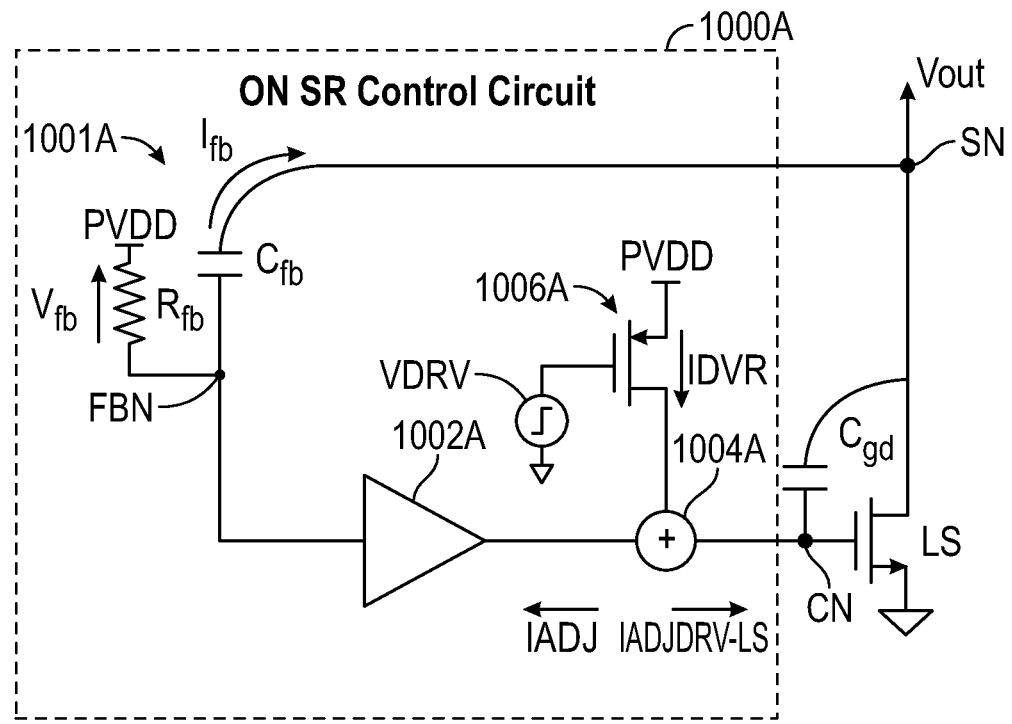
FIG. 10A is a functional block diagram of an ON a slew rate control circuit of FIG. 9 in accordance with some embodiments of the present disclosure.

FIG. 10A is a functional block diagram of an ON slew rate (SR) control circuit 1000 corresponding to one embodiment of the ON SR control circuit 910 of FIG. 9 in accordance with some embodiments of the present disclosure. In addition to the ON SR control circuit 1000A, FIG. 10A illustrates a portion of a switching output stage coupled to the SR control circuit, namely a low side power transistor LS and switching node SN of the switching output stage in this example. The parasitic gate-to-drain capacitance CGD of the low side power transistor LS is also shown. The SR control circuit 1000A implements a feedback control loop 1001A between the switching node SN and the control node CN of the low side power transistor LS. The feedback control loop 1001A operates to maintain the adjusted drive current IADJDRV-LS on the control node CN of the low side the power transistor LS such that the slew rate SR of the output voltage signal VOUT on the switching node SN is maintained at the desired value.

The feedback control loop 1001A includes a feedback capacitor CFB coupled between the switching node SN and a feedback node FBN. A resistive element RFB is coupled between the feedback node FBN and a positive supply voltage PVDD to generate a feedback voltage VFB having a value that is a function of the slew rate of the output voltage signal VOUT. An amplifier 1002A has an input coupled to the feedback node FBN and an output coupled to a summation node or circuit 1004A that is also coupled to the control node CN of the low side power transistor LS. The amplifier 1002A provides an adjustment current IADJ to the summation node or circuit 1004A. A drive transistor 1006A is also coupled to the summation node or circuit 1004A and receives a drive signal VDRV on a control node to control a drive current IDRV through the drive transistor. The summation circuit 1004A operates to provide the adjusted drive current IADJDRV-LS on the control node CN of the low side power transistor LS having a value that is equal to the drive current IDRV through the drive transistor 1006A minus the adjustment current provided IADJ provided by the amplifier 1002A (IADJDRV−LS=(IDRV−IADJ)). In this way, the amplifier 1002A operates in the feedback control loop 1001A to control the value of the adjustment current IADJ which, in turn, controls the value of the adjusted drive current IADJDRV-LS supplied on the control node CN to control the turning ON of the low side power transistor LS. The operation of the ON SR control circuit 1000A will be appreciated by one skilled in art in view of the above discussion of the SR control circuits 106 and 200A, which correspond to example embodiments of the OFF SR control circuit 908 of FIG. 9.

Figure 10B:
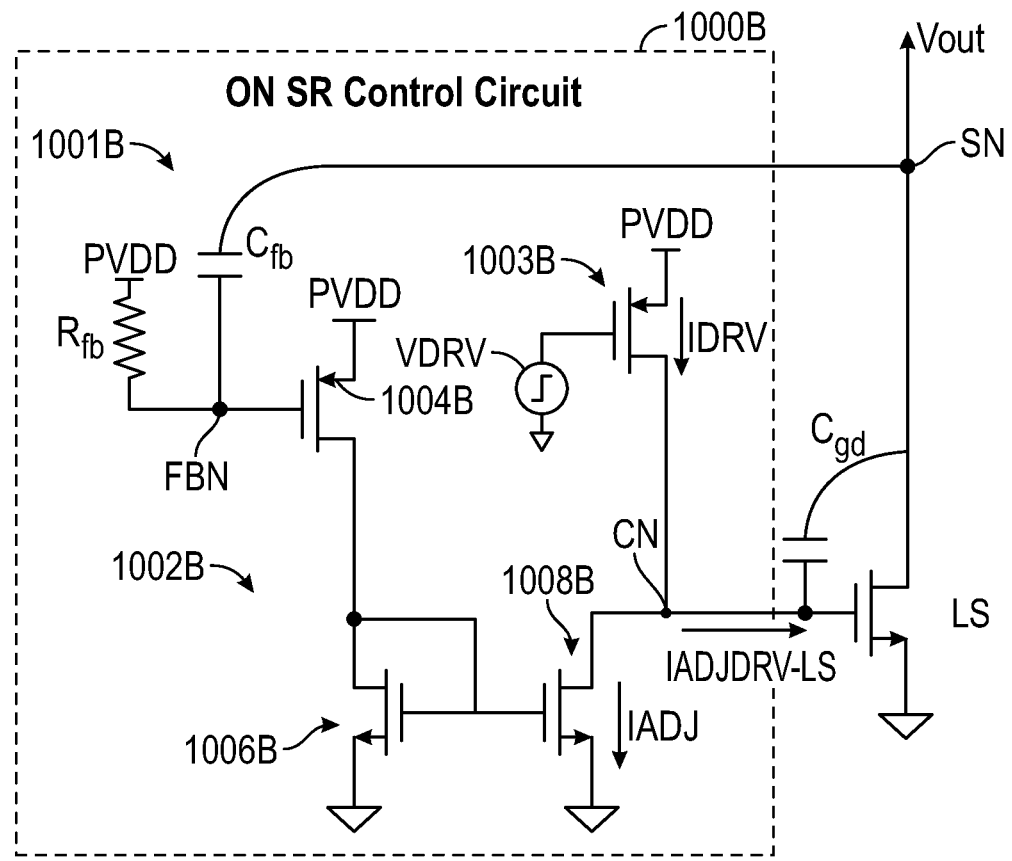
FIG. 10B is a more detailed schematic of the ON slew rate control circuit of FIG. 10A in accordance with some embodiments of the present disclosure.

FIG. 10B is a schematic of an ON SR rate control circuit 1000B corresponding to one embodiment of the ON SR control circuit 1000A of FIG. 10A in accordance with some embodiments of the present disclosure. More specifically, the ON SR control circuit 1000B illustrates a more detailed embodiment of an amplifier 1002B corresponding to the amplifier 1002A of FIG. 10A according to some embodiments of the present disclosure. The SR control circuit 1000B includes feedback control loop 1001B, a drive transistor 1003B, a feedback capacitor CFB and resistive element RFB coupled in the same way as corresponding components in the SR control circuit 1000A of FIG. 2A. The amplifier 1002B includes a transistor 1004B and diode-coupled transistor 1006B coupled in series between the supply voltage PVDD and reference voltage. A transistor 1008B is coupled between the reference voltage and the control node CN of the low side power transistor LS and has a control node coupled to the control node of diode-coupled transistor 1006B to supply the adjustment current IADJ to the control node CN of the power transistor LS. A control node of the transistor 1008B is coupled to the interconnected gate and drain of the diode-coupled transistor 1006B to form a current mirror. The sizes of the transistors 106B, 108B are set to provide the required adjustment current IADJ through the transistor 1008B in response to a corresponding current through diode-coupled transistor 1006B. The operation of the ON SR control circuit 1000B will be appreciated by one skilled in art in view of the above discussion of the SR control circuits 106 and 200B, which correspond to more detailed example embodiments of the OFF SR control circuit 908 of FIG. 9.

Figure 11A:
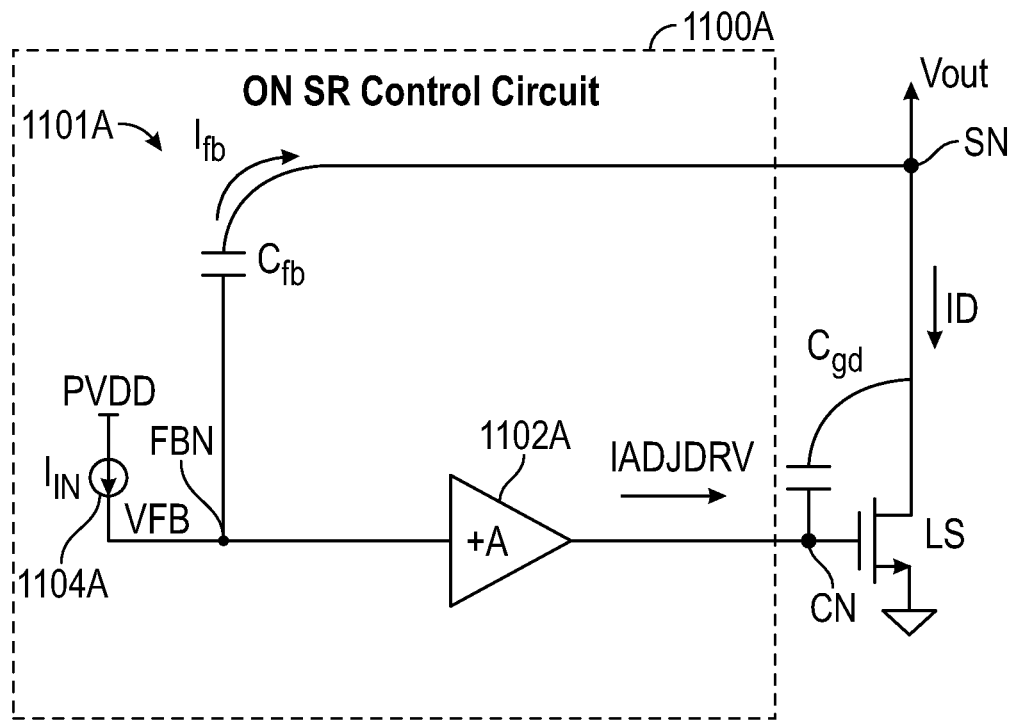
FIG. 11A is a functional block diagram of an ON a slew rate control circuit of FIG. 9 in accordance with some embodiments of the present disclosure.

FIG. 11A is a functional block diagram of an ON SR control circuit 1100A of FIG. 9 in accordance with some embodiments of the present disclosure. The ON SR control circuit 1100A includes a feedback control loop 1101A that directly controls the adjusted drive current IADJDRV that is provided on the control node CN of the low side power transistor LS. In addition to the ON SR control circuit 1100A, FIG. 5A illustrates a portion of a switching output stage coupled to the ON SR control circuit, namely the low side power transistor LS and the switching node SN of the switching output stage. The feedback control loop 1101A includes a feedback capacitor CFB coupled between the switching node SN and a feedback node FBN. A current source IIN is coupled between the feedback node FBN and a positive supply voltage PVDD to generate a feedback voltage VFB on the feedback node having a value that is a function of the slew rate of the output voltage signal VOUT. An amplifier 1102A has an input coupled to the feedback node FBN and an output coupled to the control node CN of the low side power transistor LS to directly control the adjusted drive current IADJDRV provided to control the low side power transistor. In operation, the voltage VFB having a value that is proportional to the slew rate SR of the output voltage signal VOUT is provided to the amplifier 1102A, with the amplifier controlling the adjusted drive current IADJDRV to thereby control the low side power transistor LS to maintain the slew rate SR of the output voltage signal VOUT at the desired value.

Figure 11B:
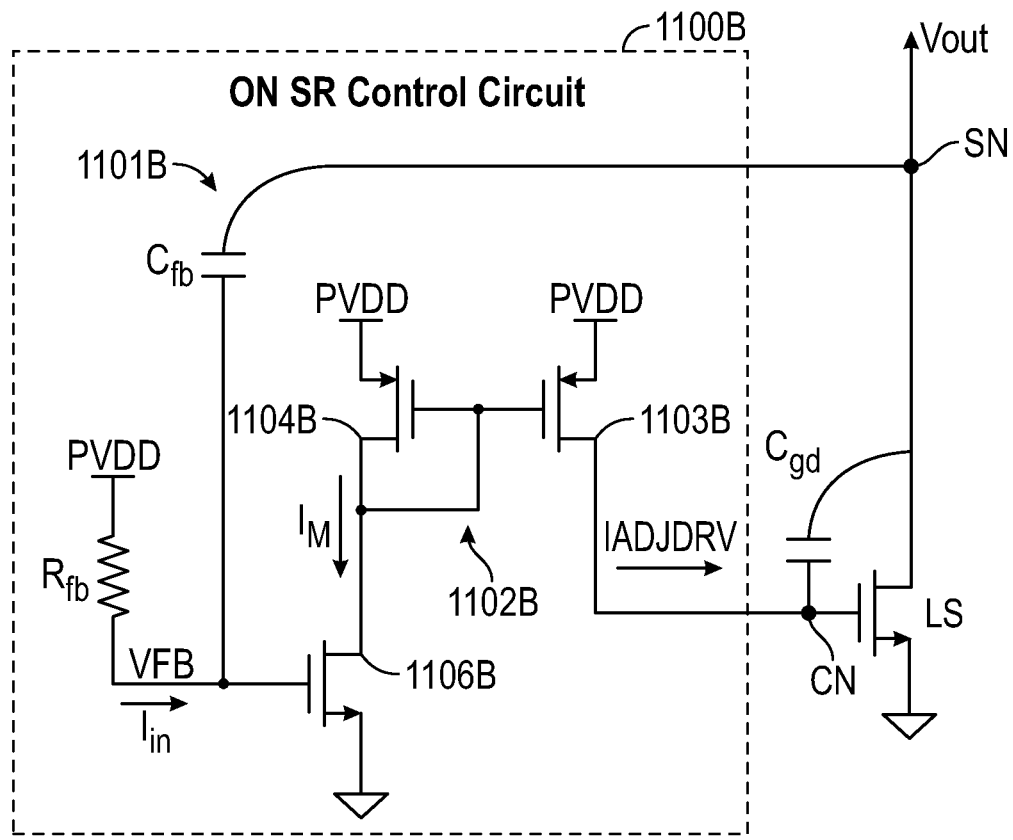
FIG. 11B is a more detailed schematic of the ON slew rate control circuit of FIG. 11A in accordance with some embodiments of the present disclosure.

FIG. 11B is a more detailed schematic of an ON SR control circuit 1100B corresponding to one embodiment of the ON slew rate control circuit 1100A of FIG. 11A in accordance with some embodiments of the present disclosure. The ON SR control circuit 500B illustrates a more detailed embodiment of an amplifier 1102B corresponding to the amplifier 1102A of FIG. 5A according to some embodiments of the present disclosure. The ON SR control circuit 1100B includes feedback control loop 1101B including a feedback capacitor CFB and a resistive element RFB coupled between a positive supply voltage PVDD and the feedback node FBN. The resistive element forms the current source IIN of FIG. 11A in this embodiment. The amplifier 1102B includes a transistor 1103B coupled between the control node CN of the low side power transistor LS and the positive supply voltage PVDD. A control node of the transistor 1103B is coupled to a diode-coupled transistor 1104B to form a current mirror, with the transistor 1104B being coupled in series with a transistor 1106B between the positive supply voltage PVDD and a reference voltage. A control node of the transistor 1106B is coupled to the feedback node FBN. In operation, the feedback voltage VFB is generated having a value that is proportional to the slew rate SR of the output voltage signal VOUT on the switching node SN. In response to the feedback voltage VFB, the transistor 1106B is activated to control a voltage on the interconnected drain and gate of the diode-coupled transistor 1104B and supply a current IM through this transistor. The current IM through the diode-coupled transistor 1104 is mirrored by the transistor 1103B to generate the adjusted drive current IADJDRV supplied to the control node CN of the low side power transistor LS. The ON SR control circuit 1100B would be activated to turn ON the low side power transistor LS and control the slew rate SR of the output voltage signal VOUT in response to the low side drive control signal DCSLS (FIG. 9) being driven to a level indicating that the low side power transistor LS is to be turned ON.

Reference has been made in this document in detail to specific example embodiments for carrying out the inventive subject matter. Examples of these specific embodiments are illustrated in the accompanying drawings, and specific details are set forth in the description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A driver circuit, comprising:
  a switching output stage including a high side power transistor and a low side power transistor coupled between a supply voltage node and a reference voltage node, each of the high side and low side transistors including a respective control node and a switching node being defined at an interconnection of the high and low side transistors, the switching output stage configured, in response to an adjusted drive current on the control node of the low side power transistor, to control switching of the low side power transistor to generate an output voltage and an output current on the switching node; and
  a control drive circuit coupled to the control node of the low side power transistor and coupled to the switching node, the control drive circuit including:
  a slew rate control circuit configured to control the adjusted drive current on the control node of the low side power transistor responsive to the slew rate of the output voltage to cause the low side power transistor to provide a constant slew rate for the output voltage over a range of values for the output current; and
  a reverse detector circuit coupled to the switching node and to the control node of the high side power transistor, the reverse detector circuit configured to control activation of the high side power transistor in response to the output voltage on the switching node reaching a switching threshold,
  wherein the control drive circuit comprises:
    a driver including a drive transistor coupled between the control node of the low side power transistor and a reference voltage node, the drive transistor including a drive control node configured to receive a drive control signal and configured to provide a drive current on the control node of the low side power transistor in response to the drive control signal; and
    the slew rate control circuit comprising:
      a feedback capacitor coupled between the switching node and a feedback node;
      a current source coupled between the feedback node and a reference voltage node, a feedback voltage being generated on the feedback node in response to a feedback current through the feedback capacitor and the feedback voltage having a value that is a function of the slew rate of the output voltage; and
      an amplifier coupled between the feedback node and the control node of the low side power transistor, the amplifier configured, in response to the feedback voltage, to provide an adjustment current on the control node of the low side power transistor, where the adjusted drive current on the control node of the low side power transistor is equal to the drive current minus the adjustment current.

2. The driver circuit of claim 1, wherein the amplifier comprises a current mirror.

3. The driver circuit of claim 1, wherein the current source comprises a resistive circuit.

4. A driver circuit, comprising:
  a switching output stage including a high side power transistor and a low side power transistor coupled between a supply voltage node and a reference voltage node, each of the high side and low side transistors including a respective control node and a switching node being defined at an interconnection of the high and low side transistors, the switching output stage configured, in response to an adjusted drive current on the control node of the low side power transistor, to control switching of the low side power transistor to generate an output voltage and an output current on the switching node; and
  a control drive circuit coupled to the control node of the low side power transistor and coupled to the switching node, the control drive circuit including:
  a slew rate control circuit configured to control the adjusted drive current on the control node of the low side power transistor responsive to the slew rate of the output voltage to cause the low side power transistor to provide a constant slew rate for the output voltage over a range of values for the output current; and
  a reverse detector circuit coupled to the switching node and to the control node of the high side power transistor, the reverse detector circuit configured to control activation of the high side power transistor in response to the output voltage on the switching node reaching a switching threshold,
  wherein the control drive circuit comprises:
    a driver including a drive transistor coupled between the control node of the low side power transistor and a reference voltage node, the drive transistor including a drive control node; and
  wherein the slew rate control circuit comprises:
    a feedback capacitor coupled between the switching node and a feedback node;
    a current source coupled between the feedback node and a reference voltage node, a feedback voltage being generated on the feedback node in response to a feedback current through the feedback capacitor and the feedback voltage having a value that is a function of the slew rate of the output voltage; and an amplifier coupled between the feedback node and the drive control node of the drive transistor, the amplifier configured, in response to the feedback voltage, to provide a signal on the drive control node of the drive transistor to cause the drive transistor to provide the adjusted drive current on the control node of the low side power transistor.

5. The driver circuit of claim 4, wherein the amplifier comprises:

a diode-coupled transistor having interconnected drain and gate nodes and a source node coupled to the reference voltage node, the gate node of the diode-coupled transistor coupled to the gate node of the drive transistor; and an amplifier transistor coupled between the supply voltage node and the interconnected drain and gate nodes of the diode-coupled transistor, a gate of the amplifier transistor coupled to the feedback node.

6. A method, comprising:

generating a feedback signal having a value that is a function of a slew rate of an output voltage on a switching node;

controlling deactivation of a first power transistor coupled between the switching node and a reference voltage node in response to the feedback signal to provide a constant slew rate for the output voltage, wherein the first power transistor includes a control node and wherein controlling deactivation of the first power transistor comprises controlling an adjusted drive current on the control node of the first power transistor;

detecting the output voltage reaching a switching voltage threshold in response to deactivation of the first power transistor; and controlling activation of a second power transistor coupled between the switching node and a supply voltage node in response to detecting the output voltage has reached the switching voltage threshold, wherein controlling the adjusted drive current on the control node of the first power transistor comprises:

providing a drive current on the control node of the first power transistor;

providing an adjustment current on the control node of the first power transistor in response to the feedback signal, the drive current minus the adjustment current being equal to the adjusted drive current.

7. The method of claim 6, wherein controlling the adjusted drive current on the control node of the first power transistor comprises controlling the adjusted drive current in response to the feedback signal to cause the first power transistor to provide a constant slew rate for the output voltage.

8. The method of claim 6, wherein the switching threshold has a value based on a value of a positive supply voltage on the supply voltage node and the slew rate of the output voltage.

9. The method of claim 6, wherein generating the feedback signal comprises:

capacitively coupling the switching node to a feedback node to generate the feedback signal on the feedback node; and generating a feedback voltage on the feedback node in response to the feedback signal.

* * * * *